(12) United States Patent
Radosavljevic et al.

(10) Patent No.: US 8,936,976 B2
(45) Date of Patent: Jan. 20, 2015

(54) CONDUCTIVITY IMPROVEMENTS FOR III-V SEMICONDUCTOR DEVICES

(75) Inventors: Marko Radosavljevic, Beaverton, OR (US); Prashant Majhi, Austin, TX (US); Jack T. Kavalieros, Portland, OR (US); Niti Goel, Austin, TX (US); Wilman Tsai, Saratoga, CA (US); Niloy Mukherjee, Beaverton, OR (US); Yong Ju Lee, Sunnyvale, CA (US); Gilbert Dewey, Hillsboro, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 331 days.

(21) Appl. No.: 12/646,711

(22) Filed: Dec. 23, 2009

(65) Prior Publication Data

US 2011/0147798 A1     Jun. 23, 2011

(51) Int. Cl.
*H01L 21/338* (2006.01)
*H01L 29/778* (2006.01)
*H01L 21/225* (2006.01)
(Continued)

(52) U.S. Cl.
CPC ........ *H01L 29/7787* (2013.01); *H01L 21/2256* (2013.01); *H01L 29/20* (2013.01); *H01L 29/42316* (2013.01); *H01L 29/47* (2013.01);
(Continued)

(58) Field of Classification Search
USPC ........... 257/194, E29.246, E21.403; 438/172, 438/249, 365, 368, 371, 392, 558
See application file for complete search history.

(56) References Cited

U.S. PATENT DOCUMENTS 5,408,106 A * 4/1995 Seabaugh ........................ 257/17
6,281,528 B1 * 8/2001 Wada ............................ 257/200
(Continued)

FOREIGN PATENT DOCUMENTS

JP     01-264270     10/1989
JP     05-013467     1/1993
(Continued)

OTHER PUBLICATIONS

International Search Report from related PCT Application No. US2010/058784, mailed Aug. 25, 2011, 3 pages.
(Continued)

*Primary Examiner* — Colleen A Matthews
*Assistant Examiner* — Colleen E Snow
(74) *Attorney, Agent, or Firm* — Blakely, Sokoloff, Taylor & Zafman LLP (57) ABSTRACT

Conductivity improvements in III-V semiconductor devices are described. A first improvement includes a barrier layer that is not coextensively planar with a channel layer. A second improvement includes an anneal of a metal/Si, Ge or Silicon-Germanium/III-V stack to form a metal-Silicon, metal-Germanium or metal-SiliconGermanium layer over a Si and/or Germanium doped III-V layer. Then, removing the metal layer and forming a source/drain electrode on the metal-Silicon, metal-Germanium or metal-SiliconGermanium layer. A third improvement includes forming a layer of a Group IV and/or Group VI element over a III-V channel layer, and, annealing to dope the III-V channel layer with Group IV and/or Group VI species. A fourth improvement includes a passivation and/or dipole layer formed over an access region of a III-V device.

20 Claims, 10 Drawing Sheets (51) Int. Cl.
   H01L 29/20     (2006.01)
   H01L 29/423    (2006.01)
   H01L 29/47     (2006.01)
   H01L 29/66     (2006.01)
(52) U.S. Cl.
   CPC .... *H01L 29/66431* (2013.01); *H01L 29/66462* (2013.01)
   USPC ........... 438/172; 438/365; 438/368; 438/371; 257/194; 257/E29.246; 257/E21.403

(56) References Cited

U.S. PATENT DOCUMENTS

| | | | |
|---|---|---|---|
| 6,867,078 B1* | 3/2005 | Green et al. | 438/167 |
| 2002/0175343 A1 | 11/2002 | Kawazu | |
| 2003/0001219 A1 | 1/2003 | Chau et al. | |
| 2003/0011037 A1 | 1/2003 | Chau et al. | |
| 2005/0051793 A1* | 3/2005 | Ishida et al. | 257/119 |
| 2005/0148130 A1 | 7/2005 | Doczy et al. | |
| 2005/0258451 A1 | 11/2005 | Saxler et al. | |
| 2006/0046399 A1 | 3/2006 | Lindert et al. | |
| 2006/0202266 A1 | 9/2006 | Radosavljevic et al. | |
| 2006/0286755 A1 | 12/2006 | Brask et al. | |
| 2007/0004123 A1 | 1/2007 | Bohr et al. | |
| 2007/0123003 A1 | 5/2007 | Brask et al. | |
| 2007/0138565 A1 | 6/2007 | Datta et al. | |
| 2007/0152266 A1 | 7/2007 | Doyle et al. | |
| 2007/0155063 A1 | 7/2007 | Datta et al. | |
| 2007/0155142 A1 | 7/2007 | Jin et al. | |
| 2007/0264837 A1 | 11/2007 | Rachmady et al. | |
| 2007/0287259 A1 | 12/2007 | Kavalieros et al. | |
| 2008/0132081 A1 | 6/2008 | Shaheen et al. | |
| 2008/0135894 A1 | 6/2008 | Bohr et al. | |
| 2008/0142786 A1 | 6/2008 | Datta et al. | |
| 2008/0203381 A1 | 8/2008 | Hudait et al. | |
| 2008/0237572 A1 | 10/2008 | Chui et al. | |
| 2008/0241423 A1 | 10/2008 | Blackwell et al. | |
| 2009/0001350 A1 | 1/2009 | Hudait et al. | |
| 2009/0218603 A1 | 9/2009 | Brask et al. | |
| 2009/0218640 A1* | 9/2009 | Hampp | 257/412 |
| 2009/0230480 A1 | 9/2009 | Shifren et al. | |
| 2009/0308636 A1* | 12/2009 | Chudzik et al. | 174/126.4 |
| 2009/0325350 A1 | 12/2009 | Radosavljevic et al. | |
| 2010/0123205 A1* | 5/2010 | de Souza et al. | 257/410 |
| 2010/0155954 A1 | 6/2010 | Mukherjee et al. | |
| 2011/0284982 A1* | 11/2011 | Manabe | 257/432 |

FOREIGN PATENT DOCUMENTS

| | | |
|---|---|---|
| JP | 05-175245 | 7/1993 |
| JP | 06-188274 | 7/1994 |
| JP | 07-263664 | 10/1995 |
| JP | 09-074186 | 3/1997 |
| JP | 2001-358075 | 12/2001 |
| JP | 2002-217212 | 8/2002 |
| JP | 2004-103707 | 4/2004 |
| JP | 2005-210105 | 8/2005 |
| JP | 2006-319122 | 11/2006 |
| JP | 2009-054807 | 3/2009 |
| WO | 2007/149581 A2 | 12/2007 |

OTHER PUBLICATIONS

Written Opinion of the International Searching Authority, from related PCT Application No. US2010/058784, mailed Aug. 25, 2011, 4 pages.

International Preliminary Report on Patent Ability, from related PCT Application No. US2010/058784, mailed Jun. 26, 2012, 5 pages.

A. Callegari et al., Propererties of SiO2/Si/GaAs structures formed by solid phase epitaxy of amorphous Si on GaAs, Appl. Phys. Lett. 58 (22), Jun. 3, 1991, pp. 2540-2542.

A. M. Sonnet et al. Performance enhancement of n-channel inversion type InxGa1—xAs metal-oxide-semiconductor field effect transistor using ex situ deposited thin amorphous silicon layer, Applied Physics Letters 93 (12), 2008, pp. 122109-1-122109-3.

A. Villanueva et al., Drain Corrosion in RF Power GaAs PHEMTs, Massachusetts Institute of Technology (MIT), 2007 IEEE, pp. 393-396.

B. Coss et al., CMOS Band-Edge Schottky Barrier Heights Using Dielectric-Dipole Mitigated (DDM) Metal/Si for Source/Drain Contact Resistance Reduction, 2009 Symposium on VLSI Technology Digest of Technical Papers, 2009, pp. 104-105.

D. Kim et al., Logic Performance of 40 nm InAs HEMTs, Massachusetts Institute of Technology (MIT), 2007 IEEE, pp. 629-632.

D. S. L Mui et al., Electrical characteristics of Si3N4/Si/GaAs metal-insulator-semiconductor capacitor, Appl. Phys. Lett. 59 (22), Nov. 25, 1991, pp. 2847-2849.

F. Zhu et al., Depletion-mode GaAs metal-oxide-semiconductor field-effect transistor with amorphous silicon interface passivation layer and thin HfO2 gate oxide, Applied Physics Letters 91 (4), 2007, pp. 043507-1-043507-3.

G.G. Fountain et al., GaAs MIS Structures with SiO2 Using a Thin Silicon Interlayer, Electronic Letters vol. 24, No. 18, 1988, pp. 1134-1135.

H. Hasegawa et al., Control of Compound Semiconductor-Insulator Interfaces by an Ultrathin Molecular-Beam Epitaxy Si Layer, Journal of Vacuum Science & Technology B 7 (4), Jul./Aug. 1989, pp. 870-878.

I. Ok et al., Influence of the substrate orientation on the electrical and material properties of GaAs metal-oxide-semiconductor capacitors and self-aligned transistors using HfO2 and silicon interface passivation layer, Applied Physics Letters 92 (20), 2008, pp. 202908-1-202908-3.

I. Ok et al., Metal gate HfO2 metal-oxide-semiconductor structures on InGaAs substrate with varying Si interface passivation layer and postdeposition anneal condition, Journal of Vacuum Science & Technology B 25 (4), Jul./Aug. 2007, pp. 1491-1494.

J. Joh et al., Gate Current Degradation Mechanisms of GaN High Electron Mobility Transistors, Massachusetts Institute of Technology (MIT), IEEE 2007, pp. 385-388.

J. M. Hergenrother et al., The Vertical Replacement-Gate (VRG) Mosfet: A 50-nm Vertical MOSFET with Lithography-Independent Gate Length, IEDM, IEEE 1999, pp. 75-78.

K. Iwamoto et al., Re-examination of Flat-Band Voltage Shift for High-k MOS Devices, 2007 Symposium on VLSI Technology Digest of Technical Papers, 2007, pp. 70-71.

M. J. W. Rodwell et al., Technology Development & Design for 22 nm InGaAs/InP-channel MOSFETs, Indium Phosphide and Related Materials 2008, IPRM 2008, 20th International Conference, pp. 1-6.

N. Waldron et al., 90 nm Self-aligned Enhancement-mode InGaAs HEMT for Logic Applications, Massachusetts Institute of Technology (MIT), Electron Devices Meeting, IEDM 2007, IEEE International, 2007, pp. 633-636.

P. Sivasubramani et al., Dipole Moment Model Explaining nFET Vt Tuning Utilizing La, Sc, Er, and Sr Doped HfSiON Dielectrics, 2007 Symposium on VLSI Technology Digest of Technical Papers, 2007, pp. 68-69.

R. A. Sadler et al., High-speed Logic at 300K with Self-Aligned Submicrometer-Gate GaAs MESFET's, IEEE Electron Device Letters, vol. EDL-4, No. 7, Jul. 1983, pp. 215-217.

S. Tiwari et al., Unpinned GaAs MOS Capacitors and Transistors, IEEE Electron Device Letters, vol. 9. No. 9, Sep. 1988, pp. 488-490.

Y. Xuan et al., High performance submicron inversion-type enhancement-mode InGaAs MOSFETs with ALD Al2O3, HfO2 and HfAlO as gate dielectrics, Electon Devices Meeting, 2007, IEDM 2007, IEEE International, pp. 637-640.

Y. Yamamoto et al., Study of La-Induced Flat Band Voltage Shift in Metal/HfLaOx/SiO2/Si Capacitors, Japanese Journal of Applied Physics, vol. 46, No. 11, 2007, pp. 7251-7255.

T. Hoshii et al., Epitaxial lateral overgrowth of InGaAs on SiO2 from (111) Si micro channel areas, 34th International Symposium on Compound Semiconductors (ISCS-2007), physica status solidi (c), vol. 5, No. 9, Jul. 2008, pp. 2733-2735.

Notice of Preliminary Rejection, Office Action Summary for counterpart Korean Patent Application No. 2012-7016793, mailed Jul. 19, 2013, 3 pages.

(56) References Cited

OTHER PUBLICATIONS

T. Hoshii et al., Formation of InGaAs-On-Insulator Structures by Epitaxial Lateral Over Growth from (111) Si, 2007, Journal: Solid State Devices and Materials, p. 132-133.

Office Action from related Japanese Application No. 2012-540180, mailed Nov. 12, 2013, 12 pages including English Translation.

First Office Action in counterpart Chinese Application, 201080056376.4, mailed Mar. 31, 2014, 14 pages including English Translation.

Second Office Action in counterpart Japanese Application, 2012-540180, mailed Apr. 15, 2014, 16 pages including English Translation.

* cited by examiner

CONDUCTIVITY IMPROVEMENTS FOR III-V SEMICONDUCTOR DEVICES

FIELD OF INVENTION

The field of invention relates generally to semiconductor devices and associated methods of manufacture. In particular, the field of invention relates to conductivity improvements in various aspects of III-V semiconductor devices.

BACKGROUND

Figure 1:
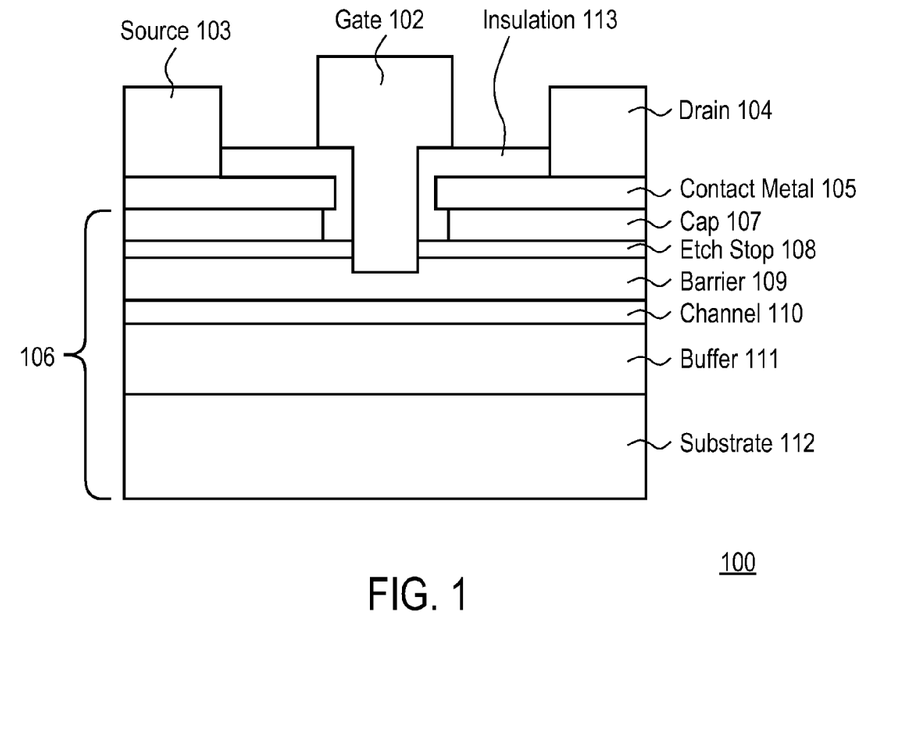
FIG. 1 shows a conventional HEMT device.

FIG. 1 shows an exemplary High Electron Mobility Transistor (HEMT) device 100. The exemplary HEMT of FIG. 1 includes a gate electrode 102, a source electrode 103 and a drain electrode 104. The gate, source and drain electrodes 102-104 are typically made of a metal or metal alloy, such as copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof, metal nitrides such as titanium nitride (TiN), tungsten nitride (WN), or tantalum nitride (TaN), or combinations thereof, metal silicide such as titanium silicide (TiSi), tungsten silicide (WSi), tantalum silicide (TaSi), cobalt silicide (CoSi), platinum silicide (PtSi), nickel silicide (NiSi), or combinations thereof, metal silicon nitride such as titanium silicon nitride (TiSiN), or tantalum silicon nitride (TaSiN), or combinations thereof, metal carbide such as titanium carbide (TiC), zirconium carbide (ZrC), tantalum carbide (TaC), hafnium carbide (HfC), or aluminum carbide (AlC), or combinations thereof, or metal carbon nitride such as tantalum carbon nitride (TaCN), titanium carbon nitride (TiCN), or combinations thereof. Other suitable materials may be used in other embodiments such as conductive metal oxides (e.g., ruthenium oxide).

A contact metal layer 105 is disposed underneath the source and drain electrodes 103, 104. The contact metal layer 105 makes physical contact to the underlying semiconductor "stack" 106 and serves as a physical interface between the metallic source/drain electrodes 103, 104 and the semiconductor stack 106. The cap layer 107 is a highly (e.g., degeneratively) doped semiconductor layer. Similar to silicides in MOSFET devices, the highly doped cap layer 107 serves to reduce/minimize the electrical resistance associated with the construction of a metal electrode upon semiconductor material.

Beneath the cap layer 107 is an etch stop layer 108. During construction of the HEMT, the semiconductor stack 106 is constructed by forming a buffer layer 111 on a substrate layer 112. Then, a channel layer 110 is formed on the buffer layer, a barrier layer 109 is formed on the channel layer 110 and the etch stop layer 108 is formed on the barrier layer 109. The cap layer is then formed on the etch stop layer. More pertinent features of the materials of the semiconductor stack 106 are described in more detail below.

Once the stack 106 is constructed, the contact metal layer 105 is formed. Using lithographic techniques, the contact metal 105 is patterned and etched to expose the underlying cap layer 107 in the region of the device where the gate will be formed. The exposed cap layer 107 material in the gate region of the device is then etched. The depth of the etch is limited to the surface of the etch stop layer 108. A layer of insulation 113 is formed over the device. A subsequent layer of photoresist is patterned to expose the underlying insulation 113 in the gate region. The exposed insulation 113 and immediately underlying etch stop 108 and barrier 109 layers are etched to form a trench for the device's recessed gate. Gate material 102 is subsequently deposited in the trench to form the recessed gate 102. The insulation is etched again over the source/drain region to expose the underlying contact metal 105. Source/drain electrodes 103/104 are then formed on the exposed contact metal.

The insulation at the levels of the contact metal 105 and cap 107 layers can be replaced with an air gap by polishing the gate metal and a first layer of insulation (not shown) to the surface of the contact metal 105 (this leaves the first insulation only at the levels of the contact 105 and cap 107 layers with a plug of recessed gate metal therein). A second layer of insulation is then coated over the wafer. Photoresist is coated on the wafer and patterned. The second layer of insulation is then etched to form openings above the gate metal plug. A gate electrode that makes contact to the gate metal plug is then formed on the second layer of insulation. The first layer of dielectric is then etched from the tip ends of the gate (e.g., by a wet etch) to form the air gap.

The semiconductor stack 106 is a heterostructure composed of layers of different semiconductor materials. Both the barrier 109 and buffer 111 layers have a larger energy band gap than the channel layer 110 to contain carriers within the channel layer 110 when the device is active thereby forming a high mobility conductive channel that extends along the channel layer 110 (notably, the conductive channel is also formed with the help of an appropriate voltage on the gate electrode 102).

According to one approach, both the barrier 109 and buffer 111 layers are made of Indium Aluminum Arsenide (InAlAs) and the channel layer 110 is made of Indium Gallium Arsenide (InGaAs) (notably, the ratio of the column III element to the column V element in III-V material for semiconductor devices is typically 1:1). Also, both the substrate 112 and etch stop 108 layers are made of Indium Phosphide (InP). The cap layer 107 may be made of Indium Gallium Arsenide or Indium Aluminum Arsenide. The contact metal may be made of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof, metal nitrides such as titanium nitride (TiN), tungsten nitride (WN), or tantalum nitride (TaN), or combinations thereof, metal silicide such as titanium silicide (TiSi), tungsten silicide (WSi), tantalum silicide (TaSi), cobalt silicide (CoSi), platinum silicide (PtSi), nickel silicide (NiSi), or combinations thereof, metal silicon nitride such as titanium silicon nitride (TiSiN), or tantalum silicon nitride (TaSiN), or combinations thereof, metal carbide such as titanium carbide (TiC), zirconium carbide (ZrC), tantalum carbide (TaC), hafnium carbide (HfC), or aluminum carbide (AlC), or combinations thereof, or metal carbon nitride such as tantalum carbon nitride (TaCN), titanium carbon nitride (TiCN), or combinations thereof. Other suitable materials may be used in other embodiments such as conductive metal oxides (e.g., ruthenium oxide).

The source/drain electrodes may be made of any of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof, metal nitrides such as titanium nitride (TiN), tungsten nitride (WN), or tantalum nitride (TaN), or combinations thereof, metal silicide such as titanium silicide (TiSi), tungsten silicide (WSi), tantalum silicide (TaSi), cobalt silicide (CoSi), platinum silicide (PtSi), nickel silicide (NiSi), or combinations thereof, metal silicon nitride such as titanium silicon nitride (TiSiN), or tantalum silicon nitride (TaSiN), or combinations thereof, metal carbide such as titanium carbide (TiC), zirconium carbide (ZrC), tantalum carbide (TaC), hafnium carbide (HfC), or aluminum carbide (AlC), or combinations thereof, or metal carbon nitride such as tantalum carbon nitride (TaCN), titanium carbon nitride (TiCN), or combinations thereof. Other suitable materials may be used in other embodiments such as conductive metal oxides (e.g., ruthenium oxide).

The gate material may be any of copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof, metal nitrides such as titanium nitride (TiN), tungsten nitride (WN), or tantalum nitride (TaN), or combinations thereof, metal silicide such as titanium silicide (TiSi), tungsten silicide (WSi), tantalum silicide (TaSi), cobalt silicide (CoSi), platinum silicide (PtSi), nickel silicide (NiSi), or combinations thereof, metal silicon nitride such as titanium silicon nitride (TiSiN), or tantalum silicon nitride (TaSiN), or combinations thereof, metal carbide such as titanium carbide (TiC), zirconium carbide (ZrC), tantalum carbide (TaC), hafnium carbide (HfC), or aluminum carbide (AlC), or combinations thereof, or metal carbon nitride such as tantalum carbon nitride (TaCN), titanium carbon nitride (TiCN), or combinations thereof. Other suitable materials may be used in other embodiments such as conductive metal oxides (e.g., ruthenium oxide).

Alternate schemes of materials may be used for the semiconductor stack. For instance, the InAlAs/InGaAs/InAlAs barrier/channel/buffer structure may be replaced with any of the following schemes: AlGaAs/GaAs/AlGaAs; or, InP/InGaAs/InP; or, InAlSb/InSb/InAlSb. Likewise, the etch stop layer 108 may be composed of InP, AlSb, and the substrate may be composed of Si, Ge, GaAs or InP. Fabrication of the individual layers is typically performed with some type of epitaxy (such as Molecular Beam Epitaxy (MBE), Vapor Phase Epitaxy (VPE), Metal-Organic Chemical Vapor Deposition (MOCVD) or Liquid Phase Expitaxy (LPE)) in order to substantially preserve a particular crystal lattice structure across the heterostructure boundaries.

In operation, carriers flow from the source electrode 103, through the contact metal 105, cap 107, etch stop 108 and barrier 109 layers into the channel layer 110. Once in the channel layer's high mobility conductive channel, the carriers flow within the channel layer 110 beneath the gate 102 and "up" into the barrier 109, etch stop 108, cap 107 and contact 105 layers associated with the drain electrode 104.

A few challenges exist with respect to the above-described HEMT carrier flow. In particular, although the carriers experience a high mobility—and therefore lower resistance—path along the channel layer 110, in contrast, the pathway through the contact/cap/etch stop/barrier structure underneath both the source and drain electrodes 103, 104 may present a number of parasitic resistances that diminish the overall performance of the transistor.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Planar Reduced Barrier Layer

Figure 2:
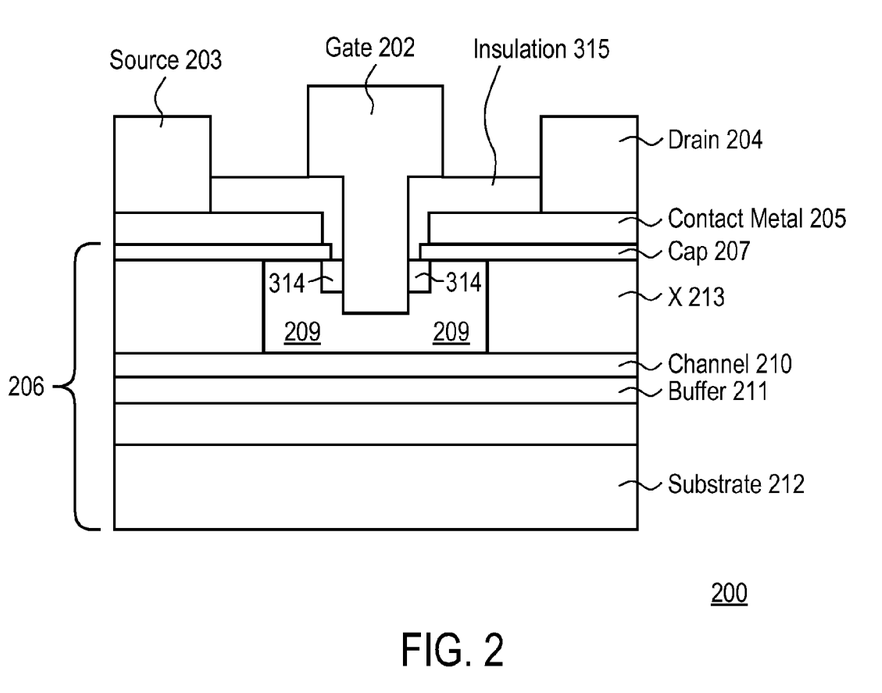
FIG. 2 shows an improved HEMT device.

Recalling the discussion in the background concerning the parasitic resistances that exist in the contact/cap/etch stop/barrier layers beneath the source and drain electrodes, FIG. 2 shows a novel device structure 200 aimed at dramatically reducing these resistances. Notably, according to the embodiment of FIG. 2, the barrier layer 209 is not coextensively planar with the other layers in the semiconductor stack 206. By reducing the planar extent of the barrier layer 209, a single layer 213 (for simplicity referred to as layer "X" or material "X") can be used beneath the source 203 and drain 204 electrodes that effectively replaces the etch stop 108 and barrier layer 109 in the contact/cap/etch stop/barrier construction of FIG. 1. That is, a contact/cap/X construction exists beneath the source/drain electrodes in the approach of FIG. 2 rather than a contact/cap/etch stop/barrier construction as observed in FIG. 1.

The contact/cap/X construction of FIG. 2 may have noticeably lower resistance than the contact/cap/etch stop/barrier construction of FIG. 1 for any of the following reasons: 1) one hetero-junction is eliminated as compared to the approach of FIG. 1; 2) two hetero-junctions are eliminated as compared to the approach of FIG. 1; 3) material "X" may have lower resistivity than either or both of the etch stop 107 or barrier layers 109 of FIG. 1.

In the case of 1) above, note that the contact/cap/X construction of FIG. 2 has one less layer than the contact/cap/etch stop/barrier construction of FIG. 1 (i.e., the etch stop layer 108 has been eliminated). The elimination of the etch stop layer 108 therefore corresponds to one less hetero-junction. Notably, although strides are made to preserve the crystal lattice structure across a hetero-junction of two different materials, it is nevertheless typical to have some defect density in the crystal lattice across the hetero-junction interface. Such defects cause "electron traps" and/or other inhomogeneities across the hetero-interface that effectively increase the resistance across the hetero-junction. Moreover, owing to differences in energy bands between the two materials of a hetero-junction, there may be some form of energy barrier at the hetero-junction interface that additionally thwarts current flow across the hetero-junction. Thus, a hetero-junction represents some degree of resistance, and, the removal of a hetero-junction will comparatively correspond to a decrease in resistance.

With respect to 2) above, in the case where material X 213 is the same material as the channel layer 210, the hetero-junction that exists between the barrier layer 109 and the channel layer 110 in the approach of FIG. 1 is eliminated. In this case, two hetero-junctions are therefore eliminated as compared to the approach of FIG. 1 (a first associated with the removal of the etch stop layer 108 and a second associated with the removal of the barrier/channel 109/110 hetero-interface) which causes even lower resistance to exist between the channel 210 and the source/drain electrodes 203, 204.

Moreover, as a general principle, the barrier layer/channel layer hetero-junction beneath the gate electrode is purposefully engineered to have a relatively large energy barrier so as to prevent leakage current beneath the gate between the gate electrode and the channel layer. In the approach of FIG. 1, the presence of this barrier 109 beneath the source and drain electrodes 103, 104 corresponds to a significant barrier to the flow of electrical current. Likewise, the removal of the barrier layer/channel layer hetero-junction beneath the source/drain electrodes as observed in FIG. 2 corresponds to the removal of this barrier.

With respect to 3) above, another reduction in resistance can be achieved as compared to the contact/cap/etch stop/barrier construction of FIG. 1 if material "X" 213 is doped to have and/or inherently has lower resistivity than either or both of the etch stop 108 or barrier layers 109. For example, Indium Phosphide and Indium Aluminum Arsenide (which are exemplary materials for the etch stop and buffer layers, respectively) have respective resistivities of 1 kOhm/square and 1 MOhm/square. By contrast, if material X 213 is doped Indium Gallium Arsenide, the resistivity can be made as low as 10 Ohm/square Therefore, lower resistance through the structure beneath the source/drain electrodes 203, 204 may be realized not only through the elimination of hetero-junctions, but also with the substitution of lower resistive material.

In general, the choice of material for material X 213 may emphasize: 1) lattice matching to the cap 207 and channel 210 layers to reduce parasitic resistances associated with imperfections in the crystal lattice across the cap/X and X/channel junctions; and, 2) lower band gap (Eg) at least as compared to the barrier layer material 209 to reduce the contribution of resistance stemming from the energy barrier that exists at the channel layer 210 interface beneath the source and drain electrodes. Notably, one embodiment that is consistent with the design approach above includes the cap 207, X 213, and channel 210 layers each being composed of the same material (e.g., Indium Gallium Arsenide, InSb, GaAs).

In further embodiments, although the same material is used, different layers may have different compositions. For example, an Indium Gallium Arsenide X layer 213 may have a higher percentage of Indium than an Indium Gallium Arsenide channel layer 210 (e.g., in the X layer, In and Ga cites may be composed of 53% In and 47% Ga whereas the channel layer has a lesser percentage of 1n (e.g., 50% In and 50% Ga for cites occupied by either Ga or As)). This corresponds to the X layer 213 having a lower Eg than the channel layer 210, which, in turn, provides for "easier" transport of electrons between the channel layer 210 and the X layer 213 because of a lowered or non-existent energy barrier.

Similarly, in order to reduce any potential barrier at the X/channel layer interface, the X layer 213 may be more heavily doped than the channel layer 210. For instance, the channel layer 210 may be n type doped but the X layer 213 may be degeneratively doped n type.

Another approach is to purposefully have some lattice mismatch between the X layer 213 and channel layer 210. Specifically, the precise material and composition of the X layer 213 is chosen to have a larger lattice constant than the channel layer 210 to induce strain within the channel layer 210 so as to increase the mobility of the channel layer 210. Using an Indium Gallium Arsenide system again, where both the X and channel layers 213, 210 are made of Indium Gallium Arsenide, the X layer 213 may again have a higher percentage of Indium than the channel layer 210 in order to establish a larger lattice constant in the X layer 213 than in the channel layer 210. For HEMT devices having a Silicon (Si) channel layer 210, the X material 213 may be Germanium (Ge) to achieve a lattice mismatch and resulting strain in the silicon channel to increase the mobility therein.

FIGS. 3a through 3k show an exemplary process for manufacturing the HEMT device of FIG. 2. Initially, as observed in FIG. 3a, a semiconductor stack is constructed by forming a buffer layer 311 on a substrate 312. Then, a channel layer 310 is formed on the buffer layer 311 and the X layer 313 is formed on the channel layer 310. As described previously, the individual layers may be epitaxially formed with various epitaxy processes such as MBE, VPE, MOCVD, or LPE. Thickness ranges for the various layers may be, in one embodiment, 0.3-10 microns for buffer layer 311, 5-20 nm for buffer layer 210, and 10-50 nm for buffer layer 313.

Figure 3A:
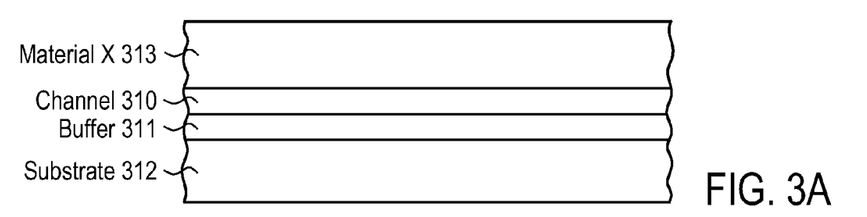
FIGS. 3a-3k show a method of manufacturing the HEMT device of FIG. 2.
Figure 3B:
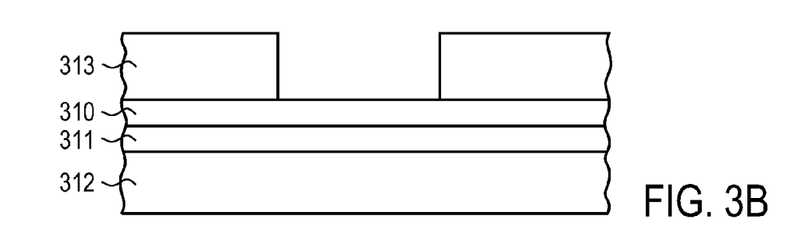

Next, as seen in FIG. 3b, the X layer 313 is patterned and etched to form an opening for the gate electrode. Various patterning and etching techniques may be used such as wet etching techniques (e.g., citric/peroxide) or dry etching techniques (e.g., CH4.He). The depth of the etch may be approximately through all of layer 313.

Figure 3C:
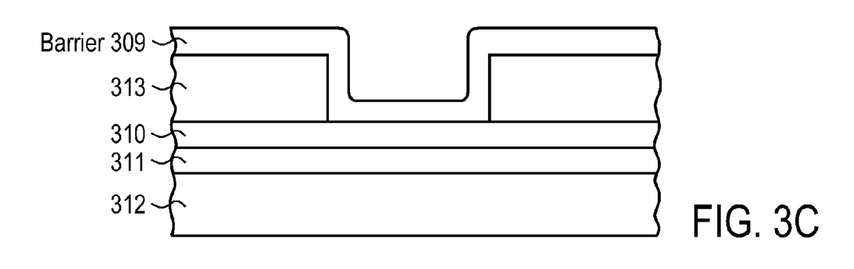
Figure 3D:
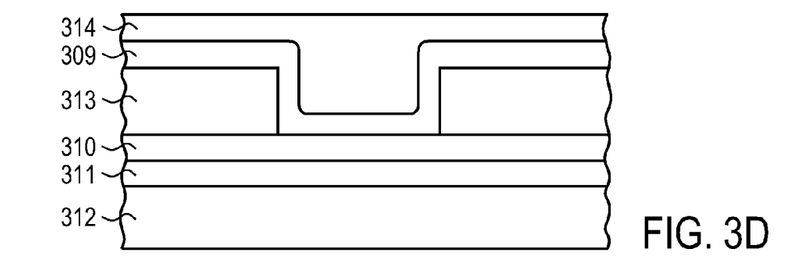
Figure 3E:
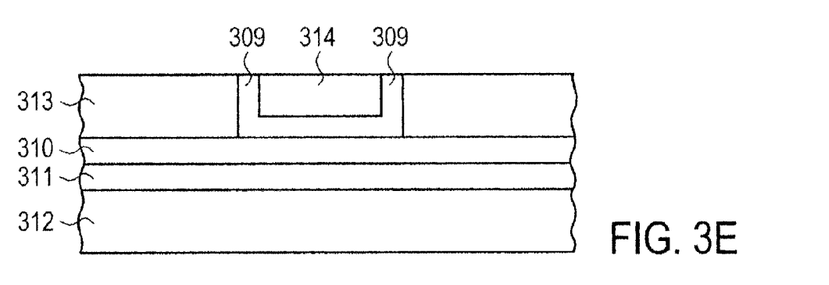

Then, as seen in FIG. 3c, the barrier layer 309 is epitaxially formed on the structure of FIG. 3b. An InP layer 314 is formed over the surface of the buffer layer 309 as seen in FIG. 3d. The resulting structure is then polished to form, as observed in FIG. 3e, a barrier layer 309 and InP layer 314 within the previously formed opening in the X layer. The InP layer is used as an etch stop as will be described in more detail below. Other materials that may be suitable include AlSb.

Figure 3F:
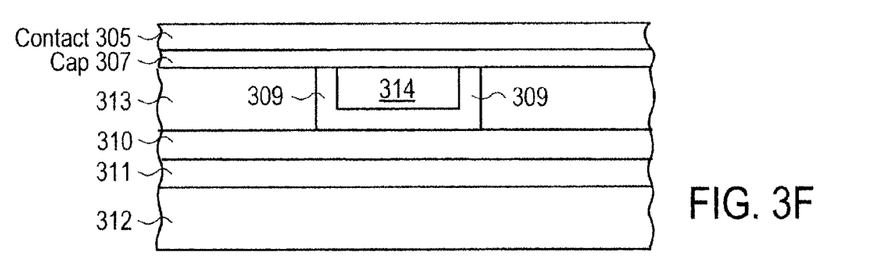
Figure 3G:
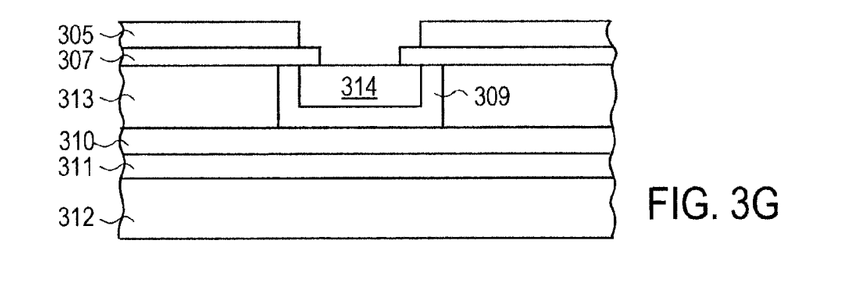
Figure 3H:
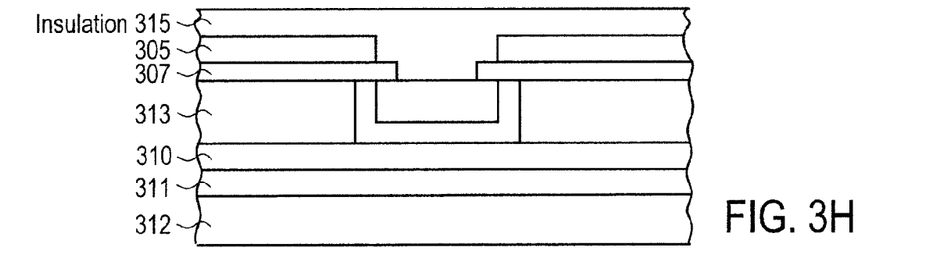
Figure 3I:
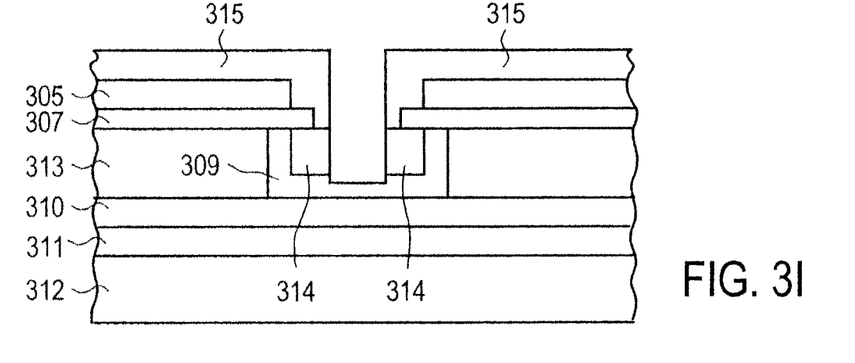
Figure 3J:
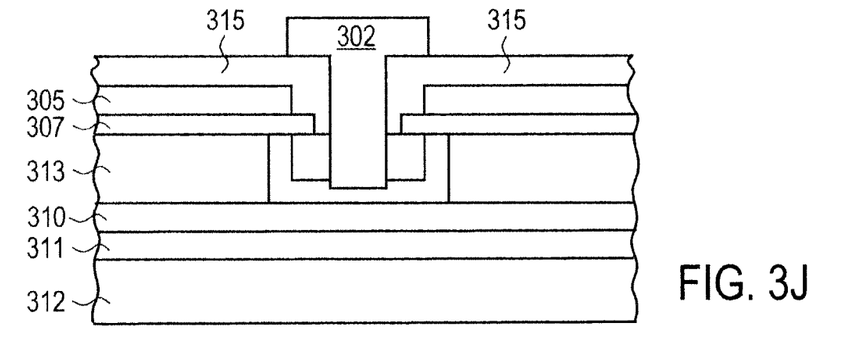

As observed in FIG. 3f, the cap 307 and contact 305 layers are deposited over the wafer surface. A photoresist layer is coated on the wafer and patterned to expose contact metal 305 over the region of the device where the gate electrode will be formed. The exposed contact 305 and underlying cap 307 layers are etched. The depth of the etch is limited by the etch stop layer 314 as observed in FIG. 3g. Then, as observed in FIG. 3h, a layer of insulation 315 is coated over the wafer. Photoresist is again coated on the wafer and patterned to expose insulation 315 residing over the region of the device where the gate will be formed. As observed in FIG. 3i, insulation 315, etch stop 314 and barrier layer 309 are etched to form an opening for the recessed gate. Gate metal 302 is then deposited in the opening to form the recessed gate 302 as observed in FIG. 3j. The insulation 315 is again etched in the region of the source/drains and source/drain electrodes 303/304 are deposited or grown (e.g., selectively) as observed in FIG. 3k.

Figure 3K:
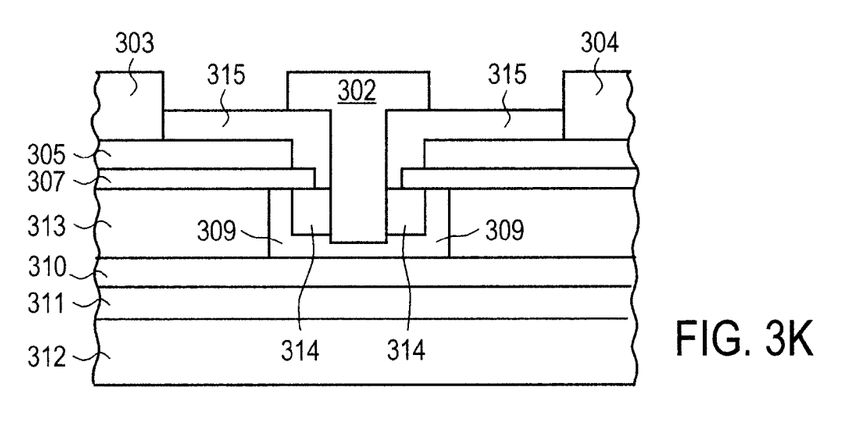

The insulation at the levels of the contact metal 305 and cap 307 layers can be replaced with an air gap by polishing the gate metal and a first layer of insulation (not shown) to the surface of the contact metal 305 (this leaves the first insulation only at the levels of the contact 305 and cap 307 layers with a plug of recessed gate metal therein). A second layer of insulation is then coated over the wafer. Photoresist is coated on the wafer and patterned. The second layer of insulation is then etched to form openings above the gate metal plug. A gate electrode that makes contact to the gate metal plug is then formed on the second layer of insulation. The first layer of dielectric is then etched from the tip ends of the gate (e.g., by a wet etch) to form the air gap.

Notably, various materials, thicknesses and processing techniques may be utilized as described with respect to FIG. 1 as appropriate.

Figure 4:
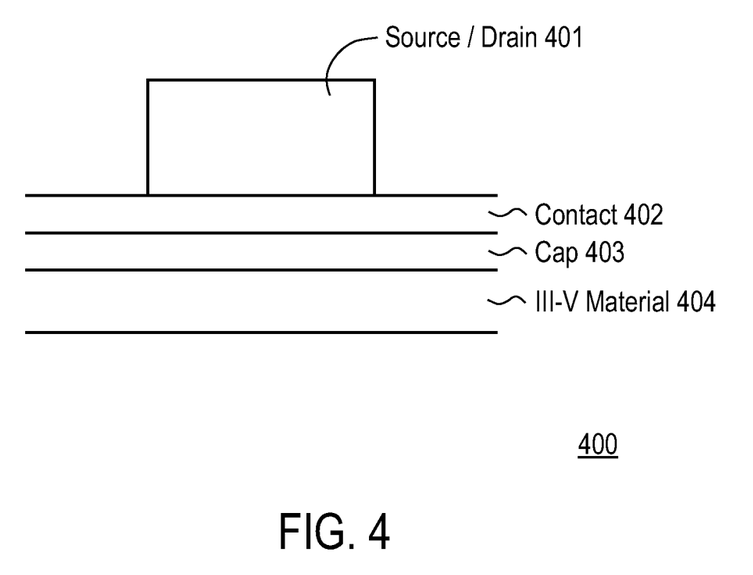
FIG. 4 shows a model of a source/drain and underlying contact structure for a III-V device.

Annealed Ni/Si or Ni/Ge Multi-Layers to Create
NiSi or NiGe Layer over Si or Ge Doped
Semiconductor Layer FIG. 4 shows a model 400 of the source/drain contact structure of many III-V based devices (such as Metal Semiconductor Field Effect Transistors (MESFETs), Metal-Oxide-Semiconductor HEMTs (MOS-HEMTs) and HEMTs). For instance, the model of FIG. 4 can be used to model not only the source/drain contact structure of the more traditional HEMT 100 observed in FIG. 1 but also the improved HEMT structure 200 observed in FIG. 2.

According to the model 400 of FIG. 4, a source/drain electrode 401 resides on a contact metal layer 402 (such as a Tungsten (W) layer). Beneath the contact metal layer 402 is a cap layer 403. The cap layer 403 is typically a semiconductor layer that is heavily doped (e.g., degeneratively doped) such that its electrical properties are akin to a metal rather than a semiconductor. The cap layer 403 resides on a III-V semiconductor material 404 that resides deeper within the III-V device. As observed in the device of FIG. 1, the III-V semiconductor layer 404 corresponds to the etch stop layer 108. As observed in the device of FIG. 2, the III-V semiconductor layer 404 corresponds to the material X layer 213.

As described previously, a problem with the source/drain contact structure of many III-V devices is the resistance it introduces between the devices, conductive channel and corresponding source/drain electrodes. FIGS. 5a through 5d show a structure and process for building a comparatively lower resistance source/drain contact structure. Notably, the structure and process of FIG. 5a through 5d can replace structures that map to the model of FIG. 4.

Figure 5A:
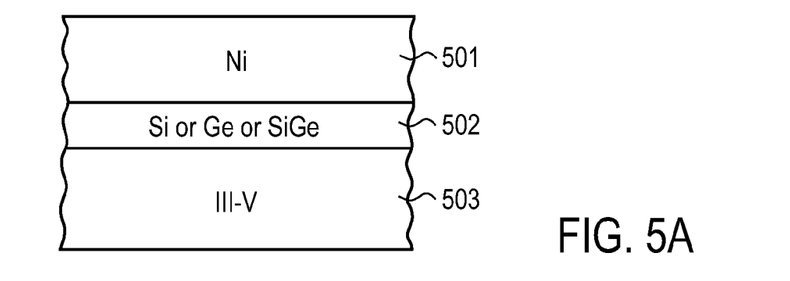
FIGS. 5a-5d show a method of manufacturing a source/drain and underlying contact structure for a III-V device.

As observed in FIG. 5a, an initial structure is created that includes a metal layer 501 (which may be composed of any of Nickel (Ni), Ti, Al, Hf, Zr and W) over a layer 502 of Silicon (Si) or Germanium (Ge) or Silicon Germanium (SiGe). For simplicity, FIGS. 5a through 5d refer to an example where metal layer 501 is composed of Ni. The layer 502 of Si or Ge or SiGe resides over a III-V semiconductor 503. Here, the Si or Ge or SiGe layer 502 may be deposited or grown over the III-V semiconductor layer 503 by any of CVD, MOCVD, MBE or ALE. The metal layer 501 may be deposited or grown over the Si or Ge or SiGe layer by any of the following processes ALE, PVD, sputtering, evaporation. In one embodiment, the metal layer 501 has a thickness within a range of 10-50 nm and the Si or Ge or SiGe layer 502 has a thickness within a range of 10-50 nm.

Once the structure of FIG. 5a is created, it is subjected to an anneal. According to various embodiments, the anneal step may have the following process parameters 200-500C in an inert atmosphere (such as N2, N2/H2, He, etc.) for a duration within a range of millisecond to 1 hour.

Figure 5B:
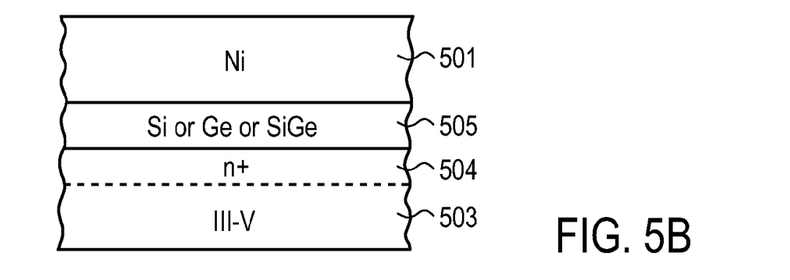

The anneal not only causes Si and/or Ge atoms to diffuse from the Si or Ge or SiGe layer 502 into the III-V semiconductor layer 503 but also cause metal atoms from the metal layer 501 to diffuse into the Si or Ge or SiGe layer 502. As observed in FIG. 5b, after the anneal process is complete, the diffusion of Si and/or Ge atoms into the III-V semiconductor layer 503 creates a highly doped semiconductor region 504, and, the diffusion of metal atoms into the Si or Ge or SiGe layer 502 creates a highly conductive layer 505 (such as, Nickel Silicon or Nickel Germanium or Nickel Silicon Germanium in the case where metal layer 501 is composed of Ni). Depths of regions 504 and 505 may respectively be in the range of 10-50 nm (with layer 504 extending all the way down to an underlying channel layer) based on the above-described anneal step and material thickness.

Figure 5C:
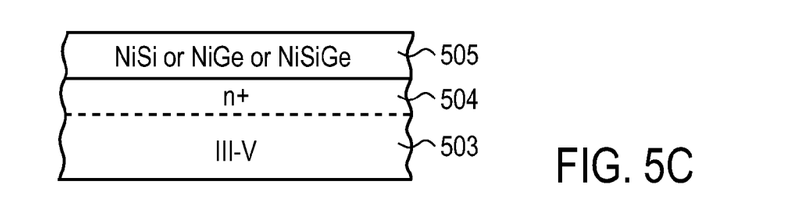
Figure 5D:
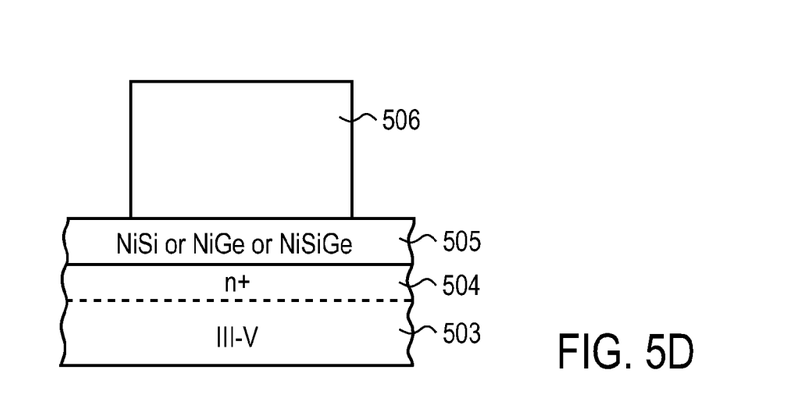

Then, as observed in FIG. 5c, the metal layer 501 is removed, and, as observed in FIG. 5d, a source or drain electrode 506 is formed on the alloy layer 505. The Ni layer may be removed by a wet etch or dry etch and the source or drain electrode 506 may be composed of any of the following materials copper (Cu), gold (Au), tungsten (W), titanium (Ti), tantalum (Ta), platinum (Pt), nickel (Ni), cobalt (Co), rhodium (Rh), ruthenium (Ru), palladium (Pd), hafnium (Hf), zirconium (Zr), or aluminum (Al), or combinations thereof, metal nitrides such as titanium nitride (TiN), tungsten nitride (WN), or tantalum nitride (TaN), or combinations thereof, metal silicide such as titanium silicide (TiSi), tungsten silicide (WSi), tantalum silicide (TaSi), cobalt silicide (CoSi), platinum silicide (PtSi), nickel silicide (NiSi), or combinations thereof, metal silicon nitride such as titanium silicon nitride (TiSiN), or tantalum silicon nitride (TaSiN), or combinations thereof, metal carbide such as titanium carbide (TiC), zirconium carbide (ZrC), tantalum carbide (TaC), hafnium carbide (HfC), or aluminum carbide (AlC), or combinations thereof, or metal carbon nitride such as tantalum carbon nitride (TaCN), titanium carbon nitride (TiCN), or combinations thereof. Other suitable materials may be used in other embodiments such as conductive metal oxides (e.g., ruthenium oxide). The source/drain electrodes may be deposited or grown by any of ALE, PVD, evaporation and electrochemical plating.

Comparing the final structure of FIG. 5d against the model of FIG. 4, note that the Si/Ge doped semiconductor layer 504 effectively replaces the cap layer 403 and the NiSi or NiGe or Ni SiGe layer 505 effectively replaces the contact metal layer 502. Here, the Si/Ge doped layer 504 corresponds to a highly doped semiconductor layer having low resistance and the NiSi or NiGe or NiSiGe layer 505 is comparable to the silicide layers used in traditional CMOS processes. Notably, the underlying III-V semiconductor layer 503 may be doped (e.g., as of its state in FIG. 5a) such that the additional doping from the diffusion of Si/Ge atoms from the Si/Ge/SiGe layer 502 causes layer 504 to be highly (e.g., degenerately) doped.

Formation of Highly Conductive, Shallow S/D Junctions in III-V Devices

Figure 6A:
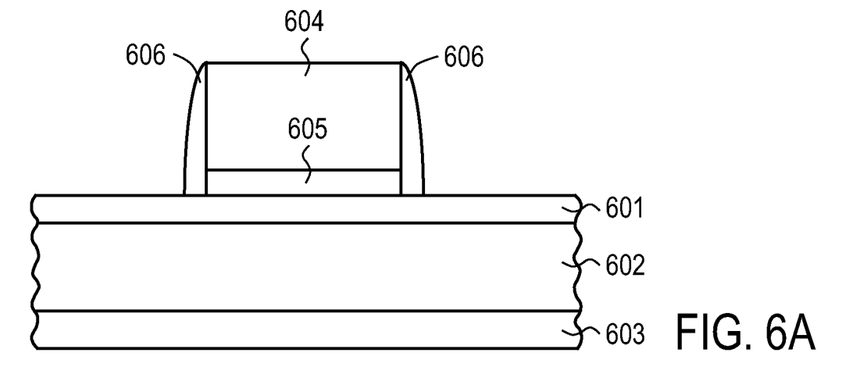
FIGS. 6a-6c show a method of manufacturing an extremely shallow, highly conductive source/drain junction.
Figure 6B:
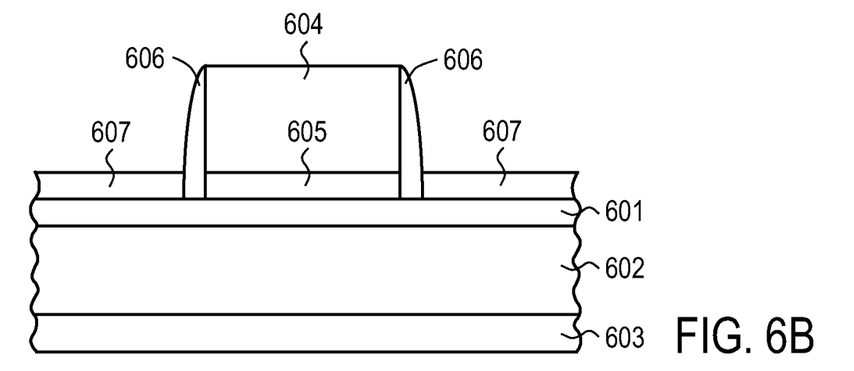
Figure 6C:
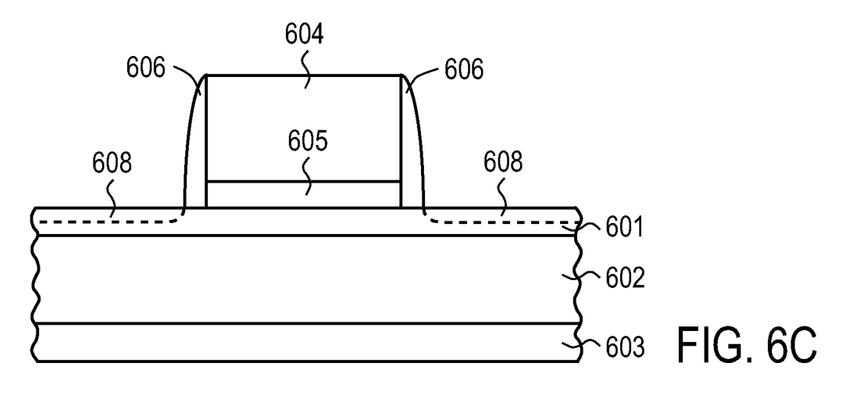

FIGS. 6a through 6c show a processing approach for forming highly conductive, shallow source/drain junctions in a III-V device. According to the process of FIGS. 6a through 6c, initially, as observed in FIG. 6a, a III-V channel layer 601 (e.g., Indium Gallium Arsenide) is disposed over a III-V buffer layer 602 (e.g., Indium Aluminum Arsenide) which, in turn, is disposed over a substrate layer 603 (e.g., Indium Phosphide). A gate electrode 604 with underlying high-K dielectric 605 and neighboring sidewalls 606 is formed over the channel layer 601 (note that this structure is a MOSFET-like HEMT (e.g., MOS-HEMT) rather than a recessed gate HEMT as discussed previously with respect to FIGS. 1 and 2).

As observed in FIG. 6b, a dopant layer 607 is deposited or grown on the exposed channel regions on both sides of the sidewall spacers 606. According to one embodiment, the dopant layer 607 is a very thin layer (e.g., a monolayer) Group IV material such as Si, Ge or Sn and/or Group VI material such as Sulfur. The thin dopant layer may be formed by any of Plasma Vapor Deposition (PVD), MBE, MOCVD, molecular implantation, Molecular Layer Deposition (MLD), infusion doping or plasma doping. According to a second embodiment, the dopant layer 607 is a spin-on-glass (SOG) mixture composed of $SiO_2$ and both Group IV and Group VI dopants (or just Group IV or Group VI dopants) suspended in a solvent solution spun over the wafer. Here, note that the thickness of the SOG may be much more than a monolayer, perhaps even exceeding the height of the gate electrode 604. Thus, FIG. 6b may be drawn more to scale for the first dopant layer embodiment rather than the second (SOG) dopant layer embodiment.

Here, the Group IV and/or Group VI elements of the dopant layer 607 are dopants that will be diffused into exposed source/drain junction regions by an anneal process that will be described further below. Before describing the anneal step, however, it is pertinent to point out that, as is known in the art, a Group IV dopant that occupies a lattice site of a Group III atom in a III-V material will contribute an extra electron, and, a Group VI dopant that occupies a lattice site of a Group V atom in a III-V material will contribute an extra electron. Thus, in the case of a Group IV dopant, dopant species are expected to contribute electrons to the III-V channel layer 601 by occupying Group III lattice sites, whereas, in the case of a Group VI dopant layer embodiment, dopant species are expected to occupy Group V lattice sites of the channel layer 601.

After the dopant layer 607 has been applied, as observed in FIG. 6c, the junction is subjected to an anneal step that causes the dopant atoms within the dopant layer 607 to diffuse into the channel layer 601. Here, owing to continued miniaturization of feature sizes (e.g., below 22 nm), the source/drain junction that is formed in the channel layer 601 by the diffusion of the dopant should not only be extremely shallow (e.g., junction depths of 10 nm or less) but also highly conductive (e.g., dopant concentrations of about 1e19/cm3 to 1e21/cm3). In order to form an extremely shallow and conductive junction, considerations as described below for the anneal step should be taken into account.

With respect to the first dopant layer embodiment, it is pertinent to point out that at least Si, Ge or Sn dopants are "amphoteric." Amphoteric Group IV dopants are capable of occupying not only Group III lattice sites but also Group V lattice sites within the channel layer 601. As the former causes electron donation but the latter does not, the ambient of the anneal step may be designed to promote Group IV dopant occupation of Group III sites and discourage Group IV dopant occupation of Group V sites. According to one approach, this may be accomplished by annealing the dopant layer 607 with overpressure (excess presence) of a Group V element such as As or Sb. Here, the overpressure of a Group V element causes the abundant Group V element to occupy Group V sites leaving the Group IV dopant to occupy primarily Group III sites as desired. Alternatively, an overpressure of a Group VI element (e.g., sulfur) may be used. In this case, the Group VI element not only occupies a Group V lattice site (to promote Group IV occupation of Group III sites as described above) but also contributes an electron thereby increasing the junction's conductivity as well.

In an even further embodiment, if a first embodiment type dopant layer 607 contains a mixture of Group IV and Group VI species, the dopant layer 607 may actually be composed of two sub-layers: a first sub-layer composed of a Group IV element and a second sub-layer composed of a Group VI element. The anneal step may then be performed with or without Group VI element overpressure. Alternatively, the dopant layer may be a single layer mixture of Group IV and Group VI species (e.g., a single layer of Si-Sulfur).

Moreover, in an embodiment, the anneal step's temperature change over time is greater than those associated with rapid thermal anneal (RTA). For example, the dopant layer may be annealed with a spike, laser or flash anneal. Here, a large temperature change over a short period of time (e.g., 1300 $\Delta T\,°$ C. and 2 $\Delta t$ ms) has the effect maximizing the number of carriers that are activated while minimizing the depth of the diffusion. Hence, highly conductive, shallow source/drain junctions are created. Moreover, the III-V semiconductor stack integrity is preserved (because III-V materials are known to have lower melting points than Si).

With respect to the second dopant layer embodiment (SOG), the dopant(s) (which may be only a Group IV element or a combination of Group IV and Group VI elements) are extracted from the SOG by a first "pre-dep" step in which the dopant(s) leave the SOG and saturate the surface of the channel layer 601 via anneal. Then, the SOG is removed in a wet etch such as an HF dip. Finally, a "drive-in" step is performed in order to diffuse the dopant(s) into the channel layer 601. Here, the drive-in step may be performed with a sudden temperature increase such as a spike, flash or laser anneal as described above. Heavier dopants may be used (e.g., 29Si, Sn, Te) to limit the diffusion depth in view of the flash temperature.

As observed in FIG. 6c, the created device has very shallow, highly conductive source/drain junctions 608. Although not depicted, source and drain electrodes are subsequently deposited or grown over these junctions. Notably, as described above, the layer beneath the gate electrode may be a high K dielectric (e.g., AlD $Al_2O_3$) in the case of a III-V MOSFET-like device or may be a barrier layer in the case of a III-V HEMT device.

It is noted that the gate electrode 604 need not have sidewall spacers 606. For instance, in an alternate approach, the barrier layer (HEMT) device or high K dielectric (MOSFET-like) device is formed over the entirety of the channel layer 601. The gate electrode is then formed over the barrier/high-K layer. The dopant layer(s) as described above for either the first or second dopant layer embodiments are then formed on exposed source/drain regions of the channel layer 601. The dopants are driven-in into the channel layer 601 and the carriers are activated. Drain electrodes are then formed over the newly formed junctions on the channel layer 601.

It is pertinent to point out that this processing technique is applicable not only to "gate first" embodiments (i.e., the gate electrode is formed before the source/drain junctions are formed as observed in FIGS. 6a-6c) but also "gate-last" embodiments. That is, for instance, the source/drain junctions may be formed in the channel layer before the barrier/high-K layer is formed over the wafer or at least the completed gate electrode.

Lastly, in the case of III-V HEMT devices, although the structures described herein do not require a "stack" of layers above the channel layer in the source/drain region (e.g., as observed in FIG. 1), the techniques described herein can also be used to form highly doped, shallow source/drain junctions in such devices as well.

Passivation and/or Dipole Layer in S/D Access Region to Remove Electron Traps on Channel Layer Surface of III-V Devices In both MOSFET-like III-V devices (e.g., MOS-HEMTs) and III-V HEMT devices, the channel layer is expected to maintain high carrier concentrations in the conduction band so as to effect a high gain device. A matter of concern in such III-V devices are surface states at or near the surface of the channel layer. Such surface states trap electrons thereby reducing the carrier concentration in the channel layer and the transconductance (gain) of the device.

Surface states may be caused by dangling bonds and/or other crystal lattice defects associated with the surface of the channel layer. Importantly, the affected area of the channel layer may include not only the region directly beneath the gate but also along the regions between the gate electrode and the source or drain electrodes (referred to as "access" regions) as well as those directly beneath the source/drain electrodes.

FIGS. 7a through 7d show different embodiments of III-V MOSFET-like devices that incorporate a passivation and/or dipole layer 701 on the surface of the channel layer 702. Here, a passivation layer effectively "passivates" the surface of the channel by forming bonds with the electron states that would otherwise correspond to dangling bonds if the passivation layer were not present. Silicon is understood to be a good passivation layer for typical III-V device channel layers such as Indium Gallium Arsenide. Other possible passivation layer materials include III-V layers such as InP, or oxide layers, such as SiO2, Al2O3, HfO2, etc).

By contrast, a dipole layer "attracts" electrons to the surface of the channel layer so as to compensate for the presence of surface states. That is, as observed in FIG. 7a, at the dipole/channel layer interface 701a/702, a positive surface charge will be present on the bottom surface of the dipole layer 701a that draws electrons to the top surface of the channel layer 702. Thus, even if surface states exist at the top surface of the channel layer 702 and those surface states are filled with electrons, the detrimental decrease in carrier concentration is largely avoided because additional electrons are drawn to the top channel layer surface by the dipole layer 701a. It is worthwhile to note the dipole layer's creation of a positive surface charge is essentially the response of the material that the dipole layer 701a is composed of to an external field that may be applied during deposition or growth of the dipole layer 701a to permanently set its dipole moment. Alternatively or in combination the dipole layer's dipole moment may be set during operation of the device such as a response to an electrical field that results from application of a voltage on the gate node. Candidate materials for the dipole layer for the III-V device include Al2O3 and La2O3.

Depending on designer choice, the passivation/dipole layer 701 may behave as a passivation layer, or may behave as a dipole layer, or may behave as a combined passivation and dipole layer. Various materials that may exhibit both passivation and dipole effects include Al2O3 and other various oxides.

Figure 7A:
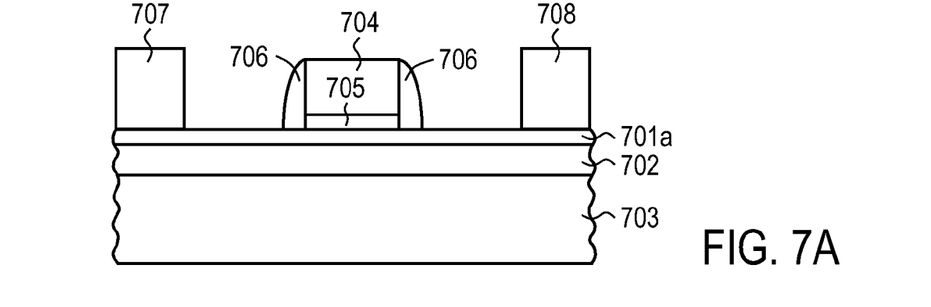
FIGS. 7a-7d show various embodiments of a passivation/dipole layer disposed on the access region of a channel layer.
Figure 7B:
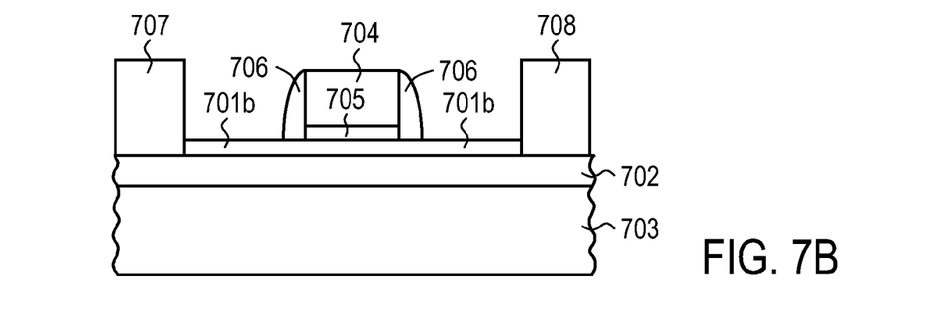
Figure 7C:
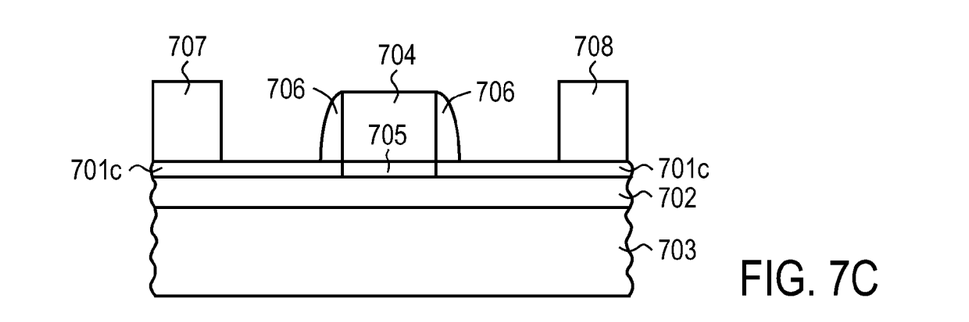

Various device structures that employ a passivation/dipole layer may be fabricated. FIG. 7a shows an embodiment where the passivation/dipole layer 701a spans across the source/drain junctions, the access regions and beneath the gate electrode 704 and gate dielectric 705. Note that the channel layer resides on the remainder 703 of the III-V semiconductor stack and/or substrate. FIG. 7b shows an embodiment where the passivation/dipole layer 701b extends only beneath the gate electrode 704 and access regions. FIG. 7c shows an embodiment where the passivation/dipole layer 701c extends from the access regions to the source/drain junctions.

Figure 7D:
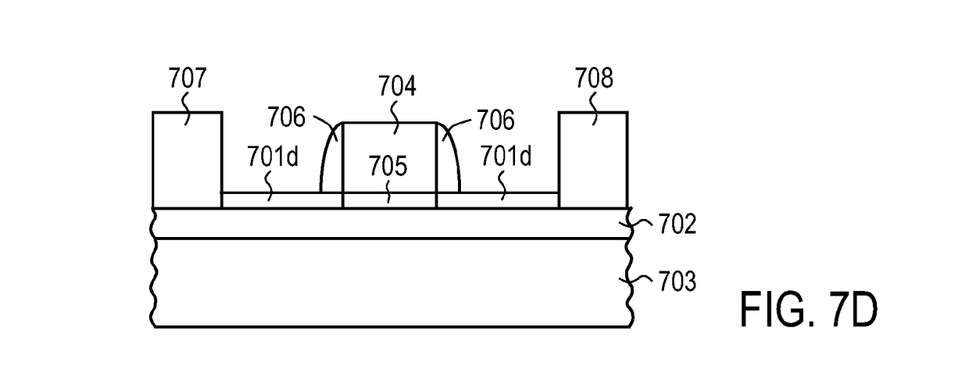

FIG. 7d shows an embodiment where the passivation/dipole layer 701d resides primarily over the access region. Here, the embodiment observed in FIG. 7d may be useful in devices where dopant concentrations or other band bending effects in the source/drain junction and gate mitigate the need for a passivation/dipole layer in these regions, and/or, the presence of the passivation/dipole layer beneath the gate or source/drain would mitigate device performance (such as increasing the parasitic resistance in the source/drain regions). Notably, although the embodiments of FIGS. 7a-7d are shown with sidewall spacers 706, sidewall spacers 706 are not necessarily required.

Comparing the various embodiments of FIGS. 7a-7d, note that the passivation/dipole layer 701a of FIG. 7 is deposited or grown over the wafer surface before the source 707, drain 708, gate dielectric 705, gate metal 704 or sidewalls 706 are formed. The embodiment of FIG. 7b may be similarly formed, or, the source/drain electrodes 707/708 may be formed prior to deposition or growth of the passivation/dipole layer 701b and gate structures 704-706. In the embodiment of FIG. 7c the passivation/dipole layer 701c may be deposited or grown before or after formation of the gate dielectric 705. In the case of the former, the passivation/dipole layer 701c may be deposited or grown over the expanse of the device's channel and then etched in the regions of the gate for subsequent gate dielectric 705 formation. In the case of the latter, the gate dielectric 705 may be etched to permit deposition or growth of the passivation/dipole layer 701c. The embodiment of FIG. 7d may be formed similarly as described just above except that the passivation/dipole layer 701d may be etched to permit subsequent deposition or growth of the source/drain electrodes 707/708. Contra-wise, the source/drain electrodes 707/708 may be formed prior to the formation of the passivation/dipole layer 701d.

Figure 8A:
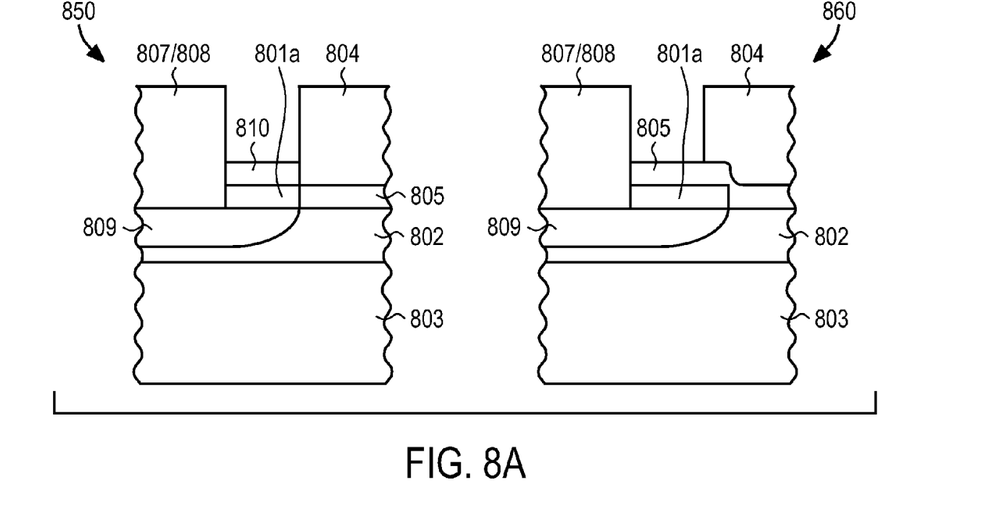
FIGS. 8a-8b show various embodiments of a passivation/dipole layer disposed on the access region of a channel layer that does not substantially extend beneath a gate electrode or source/drain electrode.
Figure 8B:
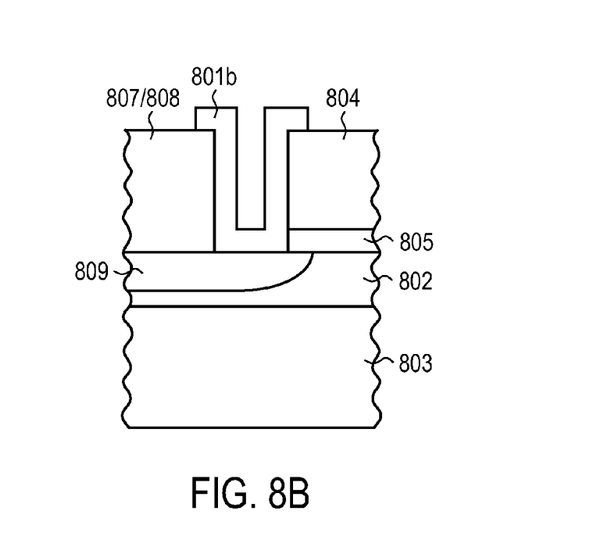

FIGS. 8a through 8c show more detailed embodiments of the embodiment of FIG. 7d. In particular, FIG. 8a shows a pair of embodiments 850, 860, where, the passivation/dipole layer 801a of embodiment 850 may be formed after formation of the gate dielectric 805, whereas, the passivation/dipole layer 801a of embodiment 860 may be formed prior to formation of the gate dielectric layer 805. Notably, in both embodiments, the passivation/dipole layer runs coextensively with the source/drain junction 809. However, the tip of the source/drain junction 809 is aligned with a gate edge in embodiment 850 whereas the tip of the source/drain junction 809 runs beneath the gate in embodiment 860. In the embodiment of FIG. 8b, the passivation/dipole layer 801b is formed after formation of the source/drain electrodes 807/808 and gate structure 804,805.

One of ordinary skill would understand that the various approaches may be appropriately combined in various ways. Thus, the above described approaches should not be read in isolation from each other where appropriate.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of forming a transistor, comprising:
    forming a III-V semiconductor stack by epitaxially forming a first III-V layer directly on a III-V channel layer, said III-V channel layer epitaxially formed directly on a III-V buffer layer;
    etching said first III-V layer where said transistor's gate electrode is to be placed, said etching creating a void within said first III-V layer, said III-V buffer layer not acting as an etch stop for said etch;
    epitaxially forming a barrier layer in said void that fills said void;
    forming a gate electrode over said barrier layer wherein an end of said gate electrode that is closest to said III-V channel layer extends into said barrier layer; and,
    forming source and drain electrodes over said first III-V layer.

2. The method of claim 1 wherein said first III-V layer is Indium Gallium Arsenide.

3. The method of claim 2 wherein said III-V channel layer is Indium Gallium Arsenide.

4. The method of claim 3 wherein said first III-V layer has a higher composition percentage of Indium than said III-V channel layer.

5. The method of claim 1 further comprising forming an etch stop layer within said void before said forming of said gate electrode.

6. The method of claim 5 further comprising etching through said etch stop layer and into said III-V barrier layer before said forming of said gate electrode, said gate electrode being a recessed gate electrode after said forming of said gate electrode.

7. A method, comprising:
   forming a first layer composed of Si and/or Ge on an undoped III-V material;
   forming a second metal layer on the first layer, said second metal layer composed of any of the following: Ni, Ti, Al, Hf, Zr and W;
   annealing said first layer, said second metal layer and said III-V material to:
      i) provide respective Si and/or Ge dopants into said III-V material;
      ii) provide metal of said second layer into said first layer;
   removing said second layer; and,
   forming an electrode on said first layer.

8. The method of claim 7 wherein said electrode is a source electrode.

9. The method of claim 7 wherein said electrode is a drain electrode.

10. The method of claim 7 wherein said forming a first layer includes forming said first layer by any of:
    CVD, MOCVD, MBE or ALE.

11. The method of claim 10 wherein said forming a second layer includes forming said second layer by any of:
    ALE, PVD, sputtering, evaporation.

12. The method of claim 7 wherein said forming a second layer includes forming said second layer by any of:
    ALE, PVD, sputtering, evaporation.

13. A method of forming a transistor, comprising:
    forming a layer of material composed of a Group IV element and a Group VI element on an exposed undoped region of a channel layer, said channel layer composed of a III-V material;
    doping said exposed region of said channel layer by driving said Group IV element and said Group VI element into said exposed region of said channel layer with any of the following:
       spike anneal;
       flash anneal;
       laser anneal; and,
    forming an electrode over said doped channel layer region.

14. The method of claim 13 wherein said layer of material is a monolayer.

15. The method of claim 13 wherein said layer of material is formed by any of:
    plasma vapor deposition;
    molecular beam epitaxy;
    chemical vapor deposition;
    molecular implantation;
    molecular layer deposition;
    infusion doping;
    plasma doping.

16. The method of claim 13 wherein said layer of material is spin on glass (SOG) and said method further comprises prior to said driving:
    driving said Group IV and VI elements from the SOG to the surface of the exposed region of the channel layer; and,
    removing said SOG layer with a wet etch.

17. The method of claim 13 wherein said Group VI element occupies a Group V site of said exposed region of said channel layer.

18. The method of claim 13 wherein said doped exposed channel layer region has a dopant depth of less than 10 nm and a dopant concentration of at least 1e20/cm3.

19. A method of forming a transistor, comprising:
    forming a layer of material composed of a Group IV element on an exposed undoped region of a channel layer, said channel layer composed of a III-V material;
    doping said exposed region of said channel layer by driving said Group IV element into said exposed region of said channel layer in an environment that promotes said Group IV element's occupation of a Group III lattice site of said channel layer and not a Group V lattice site of said channel layer, wherein said environment includes overpressure of a Group V element, said driving accomplished with any of the following:
       spike anneal;
       flash anneal;
       laser anneal; and,
    forming an electrode over said doped channel layer region.

20. A method of forming a transistor, comprising:
    forming a layer of material composed of a Group IV element on an exposed undoped region of a channel layer, said channel layer composed of a III-V material;
    doping said exposed region of said channel layer by driving said Group IV element into said exposed region of said channel layer in an environment that promotes said Group IV element's occupation of a Group III lattice site of said channel layer and not a Group V lattice site of said channel layer, wherein said environment includes overpressure of a Group V element and wherein said Group V element is selected from the group consisting of:
       As;
       Sb;
    said driving accomplished with any of the following:
       spike anneal;
       flash anneal;
       laser anneal; and,
    forming an electrode over said doped channel layer region.

* * * * *